United States Patent
Hsieh

(10) Patent No.: US 9,403,981 B2
(45) Date of Patent: Aug. 2, 2016

(54) LOW DIELECTRIC RESIN COMPOSITION, AND RESIN FILM, PREPREG, PRINTED CIRCUIT BOARD MADE THEREBY

(71) Applicant: ELITE MATERIAL CO., LTD., Taoyuan (TW)

(72) Inventor: Chen Yu Hsieh, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 0 days.

(21) Appl. No.: 14/732,121

(22) Filed: Jun. 5, 2015

(65) Prior Publication Data

US 2015/0353730 A1 Dec. 10, 2015

(30) Foreign Application Priority Data

Jun. 6, 2014 (TW) .............................. 103119781 A

(51) Int. Cl.
```
C08L 7/02      (2006.01)
C08L 77/06     (2006.01)
H05K 1/03      (2006.01)
C08G 73/10     (2006.01)
C08L 79/08     (2006.01)
```

(52) U.S. Cl.
CPC .............. *C08L 77/06* (2013.01); *C08G 73/105* (2013.01); *C08G 73/1014* (2013.01); *C08G 73/1017* (2013.01); *C08G 73/1042* (2013.01); *C08G 73/1046* (2013.01); *C08G 73/1082* (2013.01); *C08L 79/08* (2013.01); *H05K 1/0353* (2013.01); *C08L 2201/02* (2013.01); *C08L 2203/20* (2013.01); *C08L 2205/03* (2013.01); *H05K 2201/012* (2013.01); *H05K 2201/0154* (2013.01); *H05K 2201/0358* (2013.01)

(58) Field of Classification Search
CPC ........................................................ C08L 77/06
USPC ........................................................ 524/538
See application file for complete search history.

(56) References Cited

U.S. PATENT DOCUMENTS

| | | | | |
|---|---|---|---|---|
| 4,283,522 A | * | 8/1981 | Takahashi | C08G 73/121 528/125 |
| 6,268,033 B1 | * | 7/2001 | Oka | C09J 7/0246 257/E23.039 |
| 7,989,081 B2 | | 8/2011 | Nozaki et al. | |
| 2005/0143534 A1 | * | 6/2005 | Dueber | B32B 27/08 525/476 |
| 2009/0306306 A1 | * | 12/2009 | Ohkido | C08G 73/1007 525/410 |
| 2011/0281126 A1 | * | 11/2011 | Nozaki | H05K 3/386 428/458 |
| 2013/0040517 A1 | * | 2/2013 | Oomori | C08K 3/0025 442/59 |

* cited by examiner

*Primary Examiner* — Doris Lee

(74) *Attorney, Agent, or Firm* — WPAT, P.C., Intellectual Property Attorneys; Anthony King

(57) ABSTRACT

A resin composition, including (A) a polyimide resin; (B) a pre-polymerized maleimide resin; (C) a thermosetting resin; and (D) a flame retardant. The reactants for use in synthesizing the polyimide resin include an acid anhydride and a diamine, with the diamine including 4,4'-diaminodiphenylmethane and its analogous compounds and polyetherdiamines. The resin composition has the following advantages, a resin film or a prepreg is manufactured from the resin composition comprises a polyimide resin synthesized from a diamine of a specific structure and a pre-polymerized maleimide resin, so as to achieve satisfactory characteristics of circuit laminates, such as a low dielectric constant, a low dissipation factor, high heat resistance, and high adhesiveness, so as to be for use in the manufacturing of metal clad laminates and printed circuit boards.

11 Claims, 1 Drawing Sheet

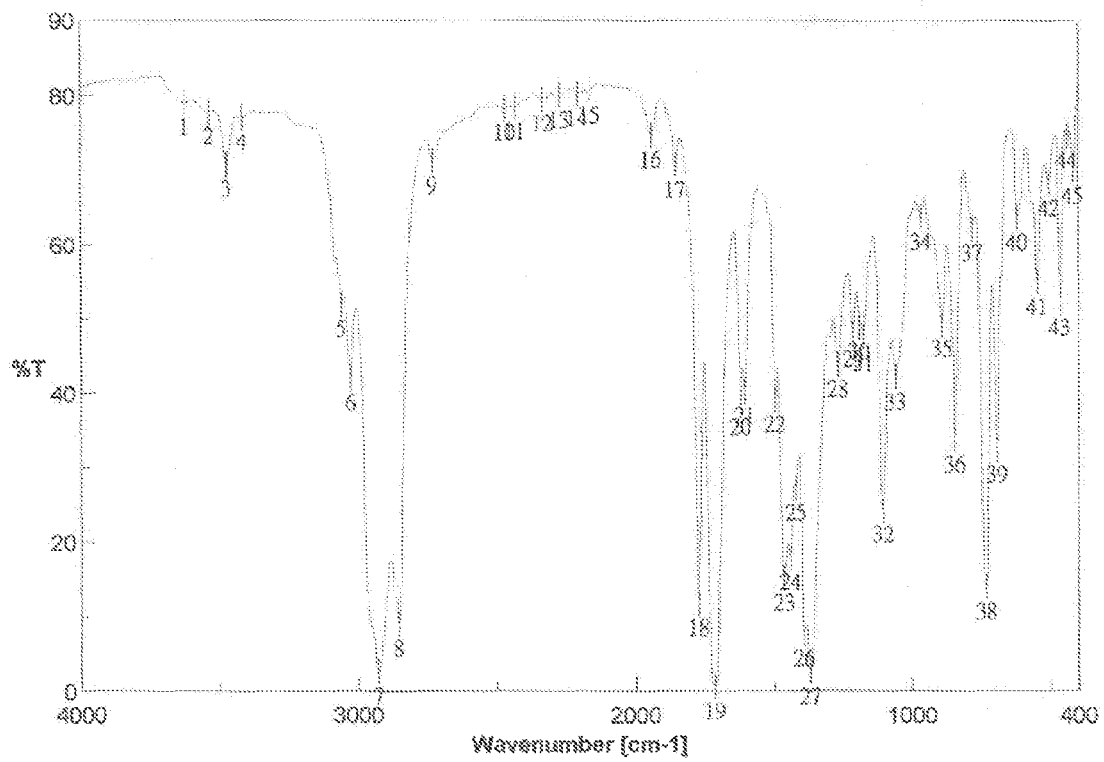
| Result of Peak Picking | | | | | | [Comment] | |
|---|---|---|---|---|---|---|---|
| No. | Position | Intensity | No. | Position | Intensity | Sample Name | PI-4 |
| 1 | 3623.59 | 76.9877 | 2 | 3534.88 | 77.7202 | Comment | |
| 3 | 3471.24 | 70.7295 | 4 | 3415.31 | 76.9873 | User | |
| 5 | 3060.48 | 51.8443 | 6 | 3025.76 | 41.9650 | Division | |
| 7 | 2925.48 | 2.5971 | 8 | 2854.13 | 8.9695 | Company | |
| 9 | 2728.78 | 71.0489 | 10 | 2468.44 | 78.1395 | | |
| 11 | 2431.9 | 78.3984 | 12 | 2333.45 | 79.3985 | [Measurement Information] | |
| 13 | 2259.81 | 79.9057 | 14 | 2206.17 | 80.1032 | Model Name | FT/IR |
| 15 | 2159.86 | 80.4805 | 16 | 1940.04 | 74.5523 | Serial Number | |
| 17 | 1853.26 | 70.5955 | 18 | 1772.26 | 11.7255 | | |
| 19 | 1714.41 | 0.5489 | 20 | 1619.91 | 38.7358 | Light Source | Source #1 |
| 21 | 1604.48 | 40.2564 | 22 | 1494.56 | 39.0498 | Detector | Detector #1 |
| 23 | 1463.71 | 15.0881 | 24 | 1440.56 | 17.9674 | Accumulation | 20 |
| 25 | 1421.28 | 27.1594 | 26 | 1390.42 | 7.6666 | Resolution | 8 cm-1 |
| 27 | 1369.21 | 2.5895 | 28 | 1267 | 43.8268 | Zero Filling | On |
| 29 | 1213.01 | 47.8238 | 30 | 1189.86 | 48.8928 | Apodization | Cosine |
| 31 | 1174.44 | 47.3439 | 32 | 1106.94 | 24.2562 | Gain | 1 |
| 33 | 1058.73 | 42.0689 | 34 | 968.09 | 63.5545 | Aperture | Auto (7.1 mm) |
| 35 | 890.952 | 40.2719 | 36 | 844.669 | 33.6907 | Scanning Speed | Auto (2 mm/sec) |
| 37 | 782.958 | 62.1306 | 38 | 732.617 | 13.9438 | Filter | Auto (30000 Hz) |
| 39 | 694.248 | 32.2632 | 40 | 619.038 | 63.4632 | | |
| 41 | 547.685 | 54.8638 | 42 | 503.33 | 68.0501 | | |
| 43 | 464.761 | 51.9974 | 44 | 439.69 | 74.5311 | | |
| 45 | 418.477 | 69.7678 | | | | | | ic dianhydride (BTDA), bisphenol-A diphthalic anhydride

LOW DIELECTRIC RESIN COMPOSITION, AND RESIN FILM, PREPREG, PRINTED CIRCUIT BOARD MADE THEREBY

CROSS-REFERENCE TO RELATED APPLICATION

This non-provisional application claims priority under 35 U.S.C. §119(a) on Patent Application No(s). 103119781 filed in Taiwan, R.O.C. on Jun. 6, 2014, the entire contents of which are hereby incorporated by reference.

FIELD OF THE INVENTION

The present invention relates to resin compositions, and more particularly, to a resin composition for use in printed circuit boards.

BACKGROUND OF THE INVENTION

The trend of new-generation electronic products is toward miniaturization and their use in high-frequency data transmission. This poses an increasingly strict requirement of the materials selected for manufacturing circuit boards, as the wirings on the circuit boards are distributed thereon at an increasingly high density. The major considerations given to electrical properties include the dielectric constant Dk and the dissipation factor Df. In general, the signal transmission speed of a laminate is inversely proportional to the square root of the dielectric constant Dk of the material from which the laminate is made, and thus the minimization of the dielectric constant Dk of the laminate material is usually advantageously important. The lower the dissipation factor Df is, the lesser the signal transmission attenuation is; hence, a material of a low dissipation factor Df provides satisfactory quality of transmission. The objective of coupling high-frequency electronic components to a circuit board is to maintain a transmission speed and ensure the integrity of the signals transmitted. The laminate of circuit board is necessary to provided with a low dielectric constant Dk and a low dissipation factor Df. Moreover, to keep electronic components operating well at a high temperature and in a high humidity environment, the circuit board must manifest such characteristics as being heat resistant, nonflammable, and of low hygroscopicity.

U.S. Pat. No. 7,989,081 (hereinafter referred to as citation 1) discloses a resin composite copper foil for use in a printed circuit board which comprises a copper foil and a resin layer which contains a polyimide block copolymer and a maleimide. The resin layer is formed on the surface of the copper foil. The polyimide block copolymer is formed from units characterized by a specific structure and a fixed range of proportions.

US2013040517 (hereinafter referred to as citation 2) discloses a resin composition for use in a printed circuit board. The resin composition comprises a polyimide resin, a thermosetting resin and a filler. The polyimide resin is formed from repeated units characterized by a specific structure and a fixed range of proportions.

Both the resin compositions disclosed in citations 1, 2 use a diamine of a specific structure, such as 1,3-bis(4-aminophenoxy)benzene (TPE-R) or 2,2-bis[4-(4-aminophenoxy)phenyl]propane (BAPP). The diamine reacts with an acid anhydride to form a polyimide resin. In practice, the use of the polyimide in forming a resin film or prepreg for manufacturing a circuit laminate has two drawbacks. First, the aforesaid polyimide resin does not dissolve in a toluene solvent. Second, the circuit laminate thus manufactured is characterized disadvantageously by high dielectric properties, dryness of the resultant laminate, numerous voids, and requiring a high lamination temperature.

Accordingly, it is important to develop a material of a low DK, a low DF, satisfactory heat resistance, and high adhesiveness, so as to be for use in printed circuit board manufacturing.

SUMMARY OF THE INVENTION

In view of the aforesaid drawbacks of the prior art, the inventor of the present invention collected related data, considered and assessed the data comprehensively, conducted tests and corrections repeatedly according to the inventor's professional experience in the related industry, and eventually devised a resin composition.

It is an objective of the present invention to provide a resin composition which comprises: (A) a polyimide resin; (B) a pre-polymerised maleimide resin; (C) a thermosetting resin; and (D) a flame retardant, wherein reactants for use in synthesizing the polyimide resin comprise an acid anhydride and a diamine. The diamine comprises 4,4'-diaminodiphenylmethane and its analogous compounds and polyetherdiamines. The present invention is characterized in that a resin film or a prepreg is manufactured from a polyimide resin synthesized from a diamine of a specific structure and a pre-polymerised maleimide resin, so as to achieve satisfactory characteristics of laminates, such as a low dielectric constant, a low dissipation factor, high heat resistance, and high adhesiveness, so as to be for use in the manufacturing of metal laminates and printed circuit boards.

In order to achieve the above and other objectives, the present invention provides a resin composition, comprising: (A) 100 parts by weight of a polyimide resin; (B) 10 to 50 parts by weight of a pre-polymerised maleimide resin; (C) 10 to 150 parts by weight of a thermosetting resin; and (D) 15 to 150 parts by weight of a flame retardant, wherein reactants for use in synthesizing the polyimide resin comprise an acid anhydride and a diamine. The diamine comprises 4,4'-diaminodiphenylmethane and its analogous compounds and polyetherdiamines.

The reactants for use in synthesizing the polyimide resin of the present invention comprise an acid anhydride (X) and a diamine (Y). The diamine (Y) comprises 4,4'-diaminodiphenylmethane and its analogous compounds and polyetherdiamines. The 4,4'-diaminodiphenylmethane and its analogous compounds comprises at least one element selected from the group consisting of 4,4'-diamino-3,3',5,5'-tetraethyldiphenylmethane (MDEA) (also known as 4,4'-methylenebis(2,6-diethylaniline)), 4,4'-diamino-3,3,5,5'-tetramethyldiphenylmethane, 4,4'-diamino-3,3'-dimethyldiphenylmethane, and 4,4'-diamino-3,3'-diethyldiphenylmethane.

The polyetherdiamine has two terminal primary amines whose polymer backbone preferably comprises oxyethylene block, oxypropylene block, or a combination thereof. The polyetherdiamine has a number average molecular weight (Mn) of 100 to 5,000 and preferably a molecular weight of 500 to 2,500, such as polyetherdiamines manufactured in the brand names Jeffamine® D-230, D-400, D-2000, D-4000, ED-600, ED-900, ED-2003, EDR-148, and EDR-176 by Huntsman.

The acid anhydride (X) preferably comprises at least one element selected from the group consisting of pyromellitic dianhydride (PMDA), 3,3',4,4'-benzophenonetetracarboxylic dianhydride (BTDA), bisphenol-A diphthalic anhydride (BisDA), and 4,4'-oxydiphthalic anhydride (OPDA).

The reactants for use in synthesizing the polyimide resin of the present invention further comprise an end-capping compound (Z) for altering a terminal reactive functional group. The end-capping compound (Z) is a phenol, an acid anhydride or an amine, such as 4-aminophenol (AMP), phthalic acid anhydride, maleic anhydride, Nadic anhydride, p-toluidine, p-anisidine, and p-phenoxyaniline. Preferably AMP is used such that not only does its amino group react with an acid anhydride to produce an imide functional group but its hydroxyl group is also kept to serve as a reactive functional group.

The reactants for use in synthesizing the polyimide resin of the present invention comprise an acid anhydride (X) and a diamine (Y). The polyimide resin is defined with the following chemical formula: X—(Y—X)n, where n denotes a positive integer from 1 to 10. When the reactants further include an end-capping compound (Z), the polyimide resin is defined with the following chemical formula: Z—X—(Y—X)n-Z, where n denotes a positive integer from 1 to 10.

The molecular weight of the polyimide resin of the present invention is expressed in terms of a number average molecular weight (Mn) and calculated to be 2,000~100,000, preferably 5,000~80,000, and most preferably 10,000~30,000. In addition, the number average molecular weight (Mn) of the polyimide resin is measured by a conventional technique, such as gel permeation chromatography (GPC), size exclusion chromatography (SEC), or matrix-assisted laser desorption ionization mass spectrometry (MALDI-MS).

When compared with polyimide resins for use in the prior art, the polyimide resin of the present invention has the following advantages:

(1) The polyimide resin of the present invention is soluble in a non-polar solution, such as toluene, and manifests a solubility of at least 30%. A commercially available conventional polyimide resin is soluble only in solvents with a high polarity and a high boiling point. The solvents, which are exemplified by dimethylacetamide (DMAC), n-methyl-2-pyrrolidone (NMP), dimethyl sulfoxide (DMSO), and dimethylformamide (DMF), usually manifest a less than 5% solubility in toluene. According to the present invention, the fact that the polyimide resin is soluble in a non-polar solution, such as toluene, facilitates a manufacturing process of the resin film, wherein the resin film undergoes a baking process so as to be baked at a low temperature (around 120° C.) to become B-stage. Conversely, a typical polyimide resin is soluble in solvents with a high boiling point, such as DMAC, NMP, DMSO, DMF, and in consequence the resin film can be produced only if the baking temperature reaches 150° C. to 200° C., thereby causing a waste of energy. In addition, According to the present invention, the fact that the polyimide resin is soluble in a non-polar solution, such as toluene, enhances the preservation of the polyimide resin and prevents it from degrading with time.

(2) The polyimide resin of the present invention features low melt viscosity and thus is fit for a lamination process which takes place at a low melting temperature, say, 80° C. to 150° C., wherein its maximum lamination temperature is 200° C. to 220° C. In general, to allow the polyimide resin to have a high melt viscosity or even to melt no more, it is necessary to carry out the lamination process at a melting temperature of 200° C. to 250° C. and have a very high maximum lamination temperature (250° C. to 350° C.). However, the aforesaid high-temperature lamination process requires a lamination machine with special specifications and thus incurs huge costs.

The reactants for use in synthesizing the pre-polymerised maleimide resin of the present invention comprise maleimide and diamines and preferably react at 50° C. to 150° C.

The maleimide preferably comprises at least one element selected from the group consisting of 4,4'-diphenylmethane bismaleimide, oligomer of phenylmethane maleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl)hexane.

The diamines preferably comprises at least one element selected from the group consisting of 4,4'-diaminodiphenylmethane and its analogous compounds, diphenyldiaminosulfone (DDS), diaminodiphenylmethane (DDM), and 3,4'-oxydianiline (ODA). The 4,4'-diaminodiphenylmethane and its analogous compounds preferably comprises at least one element selected from the group consisting of 4,4'-Diamino-3,3',5,5'-tetraethyldiphenylmethane (MDEA), 4,4'-Diamino-3,3',5,5'-tetramethyldiphenylmethane, 4,4'-Diamino-3,3'-dimethyldiphenylmethane, and 4,4'-Diamino-3,3'-diethyldiphenylmethane.

When compared with a commercially available conventional maleimide resin, the pre-polymerised maleimide resin of the present invention has advantages as follows: according to the present invention, the pre-polymerised maleimide resin is soluble in solvents, manifests high solubility, is miscible with the other resins in the resin composition, and is unlikely to separate out (or precipitate) maleimide. On the contrary, a conventional maleimide resin manifests low solubility in solvents and separates out (or precipitate) a maleimide resin after standing still for a long period of time even if it dissolves in a solvent, thereby compromising the consequent laminate characteristics.

The thermosetting resin of the present invention preferably comprises at least one element selected from the group consisting of epoxy resin, cyanate ester resin, polyphenylene ether resin, polyester resin, and phenoxy resin.

The epoxy resin of the present invention preferably comprises at least one element selected from the group consisting of bisphenol-A epoxy resin, bisphenol-F epoxy resin, bisphenol-S epoxy resin, phenol novolac epoxy resin, cresol novolac epoxy resin, biphenyl epoxy resin, biphenyl novolac epoxy resin, bisphenol-A novolac epoxy resin, trifunctional epoxy resin, tetrafunctional epoxy resin, naphthalene-containing epoxy resin, dicyclopentadiene-containing epoxy resin, phenol aralkyl novolac epoxy resin, isocyanate modified epoxy resin, dimer acid modified epoxy resin and phosphorus-containing epoxy resin.

The cyanate ester resin of the present invention preferably comprises at least one element selected from the group consisting of 2,2-Bis(4-cyanatophenyl)propane, bis(4-cyanatophenyl)ethane, bis(3,5-dimethyl-4-cyanatophenyl)methane, 2,2-Bis(4-cyanatophenyl)-1,1,1,3,3,3-hexafluoropropane, and copoly(dicyclopentadiene/phenol) cyanate ester resin. The cyanate ester resin comprises a member (preferably comprises at least one element) selected from the group consisting of cyanate ester resins manufactured in the brand names PT-30S, PT-60S, BA-230S, BA-3000S, BTP-6020S, and ULL-950S by Lonza.

The polyphenylene ether resin of the present invention preferably comprises at least one element selected from the group consisting of a hydroxy-terminated polyphenylene ether resin (such as the brand name SA-90 produced by Sabic), a vinyl or propenyl-terminated polyphenylene ether resin (such as the brand name SA-9000 produced by Sabic), and a vinyl benzyl-terminated polyphenylene ether resin (such as the brand name OPE-2st produced by Mitsubishi Gas Chemical).

The polyester resin of the present invention is preferably synthesized from aromatic compound with dicarboxylic acid groups and esterification of aromatic compound with dihydroxy group, for example, the brand name EXB-9460(HPC-8000) or EXB-9465 produced by Dainippon Ink and Chemicals Incorporated (DIC).

The flame retardant of the present invention is a phosphorus-containing flame retardant or a brominated flame retardant. The brominated flame retardant preferably comprises at least one element selected from the group consisting of ethyl-bis(tetrabromo-o-phthalimide) (for example, SAYTEX BT-93 purchased from Albemarle), 1,2-bis(pentabromophenyl)ethane (for example, SAYTEX 8010 purchased from Albemarle), and 2,4,6-Tris (2,4,6-tribromophenoxy)-1,3,5-triazine, such as the brand name FR-245 manufactured by ICL Industrial). The phosphorus-containing flame retardant preferably comprises at least one element selected from the group consisting of bisphenol diphenyl phosphate, ammonium polyphosphate, hydroquinone bis-(diphenyl phosphate), bisphenol A bis-(diphenylphosphate), tri(2-carboxyethyl) phosphine (TCEP), tri-isopropylsilyl phosphate, trimethyl phosphate (TMP), dimethyl methyl phosphonate (DMMP), resorcinol dixylenylphosphate (RDXP, such as PX-200), phosphazene (such as SPB-100), melamine polyphosphate, 9,10-dihydro-9-oxa-10-phosphaphenanthrene-10-oxide (DOPO) and its derivative or resin, melamine cyanurate, and tri-hydroxy ethyl isocyanurate. However, the present invention is not limited thereto. For instance, the flame retarding compounds include DOPO compounds, DOPO resin (such as DOPO-HQ, DOPO-NQ, DOPO-PN, and DOPO-BPN), and DOPO-bonded epoxy resin, wherein DOPO-BPN is a bisphenol-novolac compound, such as DOPO-BPAN, DOPO-BPFN, or DOPO-BPSN.

The resin composition of the present invention further comprises an inorganic filler. The inorganic filler comprises at least one element selected from the group consisting of silicon dioxide (fused, non-fused, porous, or hollow), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, quasi diamond powder, graphite, magnesium carbonate, potassium titanate, ceramic fiber, mica, boehmite (AlOOH), zinc molybdate, ammonium molybdate, zinc borate, calcium phosphate, calcinated talc, talc, silicon nitride, mullite, calcinated kaolinite, clay, alkaline magnesium sulfate whisker, mullite whisker, barium sulfate, magnesium hydroxide whisker, magnesium oxide whisker, calcium oxide whisker, carbon nanotube, nanoscale silicon dioxide, related inorganic powder, or powder particles having an organic nucleus coating and intended to decorate an insulator. The inorganic filler is spherical, fiber-like, plate-like, particle-like, sheet-like, or needle-shaped, and is selectively pretreated with a silane coupling agent.

The resin composition of the present invention further comprises a thermoplastic resin. The thermoplastic resin is a polyolefin resin, including but not limited to one, or a combination, of polybutadiene homopolymer, styrene-butadiene copolymer, styrene-butadiene-divinylbenzene terpolymer, styrene-polybutadiene-maleic anhydride terpolymer, polybutadiene-urethane-methylmethacrylate terpolymer, hydrogenated ethylene-butadiene-styrene copolymer, and styrene-isoprene-butadiene copolymer.

The resin composition of the present invention further comprises at least one element selected from the group consisting of a curing accelerator, a silane coupling agent, a toughening agent, and a solvent.

The curing accelerator of the present invention comprises a catalyst, such as a Lewis base or a Lewis acid, or comprises a peroxide. The Lewis base includes at least one of imidazole, boron trifluoride amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP), and 4-dimethylaminopyridine (DMAP). The Lewis acid comprises a metal salt compound, such as a manganese, iron, cobalt, nickel, copper, or zinc metal salt compound, for example, a metal catalyst, such as zinc caprylate, or cobalt caprylate. The peroxide includes, but is not limited to, dicumyl peroxide, tert-butyl peroxybenzoate, and di(tert-butylperoxyisopropyl)benzene (BIPB). The curing accelerator of the resin composition according to an embodiment of the present invention is preferably di(tert-butylperoxyisopropyl)benzene (BIPB).

The silane coupling agent of the present invention comprises silanes and siloxanes which are of the following types, namely amino silanes, amino siloxanes, epoxide silanes, and epoxide siloxanes, according to functional group.

The toughening agent of the present invention comprises rubber resin, carboxyl-terminated butadiene acrylonitrile (CTBN) rubber, and/or core-shell rubber.

The solvent of the present invention comprises methanol, ethanol, ethylene glycol monomethyl ether, acetone, butone (methyl ethyl ketone), methyl isobutyl ketone, cyclohexanone, toluene, xylene, methoxyethyl acetate, ethoxyethyl acetate, propoxyethyl acetate, ethyl acetate, dimethyl formamide, propylene glycol methyl ether, or a mixture thereof.

Another objective of the present invention is to provide a resin film which comprises the aforesaid resin composition. The resin film is either coated on a polyester film (PET film) or a polyimide film (PI film) or coated on a copper foil and then baked to become B-staged to eventually form a resin coated copper (RCC).

Yet another objective of the present invention is to provide a prepreg which comprises a reinforcing material and the aforesaid resin composition. The resin composition is attached to the reinforcing material by impregnation and heated up at a high temperature to become B-staged. The reinforcing material is a fibrous material, a woven fabric, or a non-woven fabric, such as a glass fabric, and is intended to increase the mechanical strength of the prepreg. Also, the reinforcing material can be selectively pretreated with a silane coupling agent.

A further objective of the present invention is to provide a laminate, such as a copper clad laminate, which comprises two or more metal foils and at least one insulating layer. The metal foils are exemplified by a copper foil and each further comprise at least one metal alloy of aluminum, nickel, platinum, silver and gold. The insulating layer is formed by curing the aforesaid prepreg or resin film at a high temperature and a high pressure. For instance, the aforesaid prepreg is disposed between two metal foils such that the two metal foils and the prepreg therebetween are laminated together at a high temperature and a high pressure to form the insulating layer.

A further objective of the present invention is to provide a printed circuit board. The printed circuit board comprises at least a said laminate and is manufactured by a conventional process.

The present invention is disclosed above by preferred embodiments. However, persons skilled in the art should understand that the preferred embodiments are illustrative of the present invention only, but should not be interpreted as restrictive of the scope of the present invention. Hence, all modifications and changes made to the aforesaid embodiments without departing from the spirit embodied in the present invention should fall within the scope of the present invention. Accordingly, the legal protection for the present invention should be defined by the appended claims.

BRIEF DESCRIPTION OF THE DRAWINGS

FIG. 1 is a graph plotted with Fourier-transform infrared spectroscopy (FTIR) on the polyimide resin of the present invention.

DETAILED DESCRIPTION OF THE PREFERRED EMBODIMENTS

To render the objectives, features and advantages of the present invention more obvious and comprehensible, the present invention is hereunder illustrated with specific embodiments and described in detail.

Production Example 1

Synthetic Polyimide Resin

Production Example 1-1

Synthetic the Polyimide Resin of the Present Invention

Diamines, namely 5 grams of MDEA and 95 grams of D-2000, are dissolved in 100 grams of DMAC solvent, placed in a glass blending reactor, and blended until the solid reactants are dissolved completely. Afterward, 0.5 gram of glacial acetic acid (functioning as a dehydrating agent) and 0.01 gram of potassium acetate (functioning as a catalyst) are introduced into the reactor and blended therein. Then, acid anhydrides, namely 10 grams of BTDA and 90 grams of OPDA, are introduced successively into the reactor and blended therein at 25° C. to 50° C. for around 4 hours, then cooled down to the room temperature to therefore produce polyimide resin PI-1-1. The aforesaid product is measured by GPC to assay its number average molecular weight. Also, the aforesaid product is assessed at a polyimide resin to solvent weight ratio 35:65 to evaluate its solubility and examined with the naked eye for any insoluble matter. The aforesaid product is graded with O if it is completely soluble and X if otherwise.

Production Examples 1-2 Through 1-6

Synthesis of the Polyimide Resin of the Present Invention

Production examples 1-2 through 1-6 differ from the aforesaid production example 1-1 in terms of the weight ratio of MDEA to D-2000. Also, unlike the aforesaid production example 1-1, production examples 1-2 through 1-6, ingredients react for around 4 hours before being joined by 0.05 gram of AMP in the reactor and heated up to 200° C. to 210° C. and maintained at 200° C. to 210° C. for 1 hour. Finally, the reactor is cooled down to the room temperature to therefore produce the polyimide resins PI-1-2 through PI-1-6. The aforesaid product is measured by GPC to assay its number average molecular weight and examined with the naked eye for any insoluble matter.

In production example 1-5, a functional group analysis is carried out by FTIR, and its FTIR spectrum is shown in FIG. 1, indicating the disappearance of a bifurcation feature absorption peak which is attributed to primary NH stretching and otherwise shown at 3600 to 3200 $cm^{-1}$ and the appearance of an imide feature absorption peak at around 1780 $cm^{-1}$ (C=O symmetrical stretching of imide), around 1720 $cm^{-1}$ (C=O asymmetrical stretching of imide) and around 1390 $cm^{-1}$ (C—N stretching of aromatic imide), thereby proving that the polyimide resin is produced successfully according to the present invention.

Production Examples 1-7 and 1-8

Synthesis of Polyimide Resins of the Comparisons

Unlike the aforesaid production examples 1-1 through 1-6 in which the diamines are provided in the form of MDEA and D-2000, production examples 1-7 and 1-8 have their diamines provided in the form of TPE-R to therefore produce polyimide resin PI-1-7 and PI-1-8, and then the product is measured by GPC to assay its number average molecular weight and examined with the naked eye for any insoluble matter.

The results of the measurement of the products and ratios of ingredients of the reactants in production example 1 are shown in Table 1.

TABLE 1

| | | PI-1-1 | PI-1-2 | PI-1-3 | PI-1-4 | PI-1-5 | PI-1-6 | PI-1-7 | PI-1-8 |
|---|---|---|---|---|---|---|---|---|---|
| Reactant | | | | | | | | | |
| diamine | MDEA | 5 | 5 | 10 | 25 | 35 | 50 | — | — |
| | D-2000 | 95 | 95 | 90 | 75 | 65 | 50 | — | — |
| | TPE-R | — | — | — | — | — | — | 100 | — |
| | BAPP | — | — | — | — | — | — | — | 100 |
| acid anhydride | BTDA | 10 | 10 | 50 | 20 | 4 | 4 | 10 | 10 |
| | OPDA | 90 | 90 | 50 | 80 | 95 | 95 | 95 | 95 |
| end-capping compound | AMP | — | 0.05 | 0.05 | 0.05 | 0.05 | 0.05 | — | 0.1 |
| Resin Characteristic | | | | | | | | | |
| solubility | toluene | O | O | O | O | O | X | X | X |
| | DMAC | O | O | O | O | O | O | O | O |
| number average molecular weight (Mn) | GPC test | 10300 | 10500 | 12500 | 17200 | 18400 | 21400 | 50600 | 61300 |

Production Examples 2

Synthesis of the Pre-Polymerised Maleimide Resin of the Present Invention 360 grams of BMI-2300, 100 grams of MDEA, and 500 grams of DMAC are placed in a glass blending reactor and blended therein at 105° C. for 12 hours to promote the reaction between the BMI-2300, MDEA, and DMAC to therefore produce miscible resin A-1.

440 grams of BMI-5100, 100 grams of MDEA, and 500 grams of DMAC are placed in a glass blending reactor and blended therein at 105° C. for 12 hours to promote the reaction between the BMI-5100, MDEA, and DMAC to therefore produce miscible resin A-2.

340 grams of BMI-1700, 100 grams of MDEA, and 500 grams of DMAC are placed in a glass blending reactor and blended therein at 105° C. for 12 hours to promote the reaction between the BMI-1700, MDEA, and DMAC to therefore produce miscible resin A-3.

570 grams of KI-80, 100 grams of MDEA, and 500 grams of DMAC are placed in a glass blending reactor and blended therein at 105° C. for 12 hours to promote the reaction between the KI-80, MDEA, and DMAC to therefore produce miscible resin A-4.

Embodiment 1-1 (E1-1)

A resin composition, comprising ingredients as follows:
(A) 100 parts by weight of PI-1-1 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 1-2 (E1-2)

A resin composition, comprising ingredients as follows:
(A) 100 parts by weight of PI-1-2 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 1-3 (E1-3)

A resin composition, comprising ingredients as follows:
(A) 100 parts by weight of PI-1-3 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 1-4 (E1-4)

A resin composition, comprising ingredients as follows:
(A) 100 parts by weight of PI-1-4 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 1-5 (E1-5)

A resin composition, comprising ingredients as follows:
(A) 100 parts by weight of PI-1-5 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 1-6 (E1-6)

A resin composition, comprising ingredients as follows:
(A) 100 parts by weight of PI-1-6 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);

(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 2 (E2)

A resin composition, comprising ingredients as follows:
(A) 100 parts by weight of PI-1-5 (polyimide resin);
(B) 15 parts by weight of A-2 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 3 (E3)

A resin composition, comprising ingredients as follows:
(A) 100 parts by weight of PI-1-5 (polyimide resin);
(B) 7.5 parts by weight of A-3 (pre-polymerised bismaleimide resin);
(C) 7.5 parts by weight of A-4 (pre-polymerised bismaleimide resin);
(D) 6 parts by weight of NC-3000H (biphenyl epoxy resin);
(E) 4 parts by weight of HP-5000 (naphthalene-containing epoxy resin);
(F) 50 parts by weight of BTP-6020 (cyanate ester resin);
(G) 60 parts by weight of Saytex 8010 (flame retardant);
(H) 0.5 part by weight of TPP-S (triphenylphosphine triphenylborane catalyst);
(I) 0.1 part by weight of DCP (peroxides);
(J) 50 parts by weight of toluene (solvent);
(K) 20 parts by weight of butanone (solvent).

Embodiment 4 (E4)

A resin composition, comprising ingredients as follows:
(A) 100 parts by weight of PI-1-5 (polyimide resin);
(B) 30 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 5 (E5)

A resin composition, comprising ingredients as follows:
(A) 100 parts by weight of PI-1-5 (polyimide resin);
(B) 6 parts by weight of NC-3000H (biphenyl epoxy resin);
(C) 4 parts by weight of HP-5000 (naphthalene-containing epoxy resin);
(D) 50 parts by weight of BTP-6020 (cyanate ester resin);
(E) 60 parts by weight of SPB-100 (phosphazene compound);
(F) 0.5 part by weight of TPP-S (triphenylphosphine triphenylborane catalyst);
(G) 0.1 part by weight of DCP (peroxides);
(H) 50 parts by weight of toluene (solvent);
(I) 20 parts by weight of butanone (solvent).

Embodiment 6 (E6)

A resin composition, comprising ingredients as follows:
(A) 100 parts by weight of PI-1-5 (polyimide resin);
(B) 15 parts by weight of A-1 (pre-polymerised bismaleimide resin);
(C) 50 parts by weight of BTP-6020 (cyanate ester resin);
(D) 60 parts by weight of SPB-100 (phosphazene compound);
(E) 0.5 part by weight of TPP-S (triphenylphosphine triphenylborane catalyst);
(F) 0.1 part by weight of DCP (peroxides);
(G) 50 parts by weight of toluene (solvent);
(H) 20 parts by weight of butanone (solvent).

Embodiment 7 (E7)

A resin composition, comprising ingredients as follows:
(A) 100 parts by weight of PI-1-5 (polyimide resin);
(B) 15 parts by weight of A-1 (pre-polymerised bismaleimide resin);
(C) 15 parts by weight of NC-3000H (biphenyl epoxy resin);
(D) 15 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 8 (E8)

A resin composition, comprising ingredients as follows:
(A) 100 parts by weight of PI-1-5 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 10 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 9 (E9)

A resin composition, comprising ingredients as follows:
(A) 100 parts by weight of PI-1-5 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 100 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Embodiment 10 (E10)

A resin composition, comprising ingredients as follows:
(A) 100 parts by weight of PI-1-5 (polyimide resin);
(B) 10 parts by weight of A-1 (pre-polymerised bismaleimide resin);
(C) 10 parts by weight of HP-5000 (naphthalene-containing epoxy resin);
(D) 60 parts by weight of BTP-6020 (cyanate ester resin);
(E) 10 parts by weight of OPE-2st (polyphenylene ether resin);
(F) 5 parts by weight of Phenoxy (phenoxy resin);
(G) 60 parts by weight of SPB-100 (phosphazene compound);
(H) 5 parts by weight of Ricon257 (polyolefin resin);
(I) 10 parts by weight of R-45vt (polyolefin resin);
(J) 10 parts by weight of Ricon184MA6 (polyolefin resin);
(K) 0.5 part by weight of TPP-S (triphenylphosphine triphenylborane catalyst);
(L) 0.1 part by weight of DCP (peroxides);
(M) 5 parts by weight of 525 (silicon dioxide filler)
(N) 50 parts by weight of toluene (solvent);
(O) 20 parts by weight of butanone (solvent).

Embodiment 11 (E11)

A resin composition, comprising ingredients as follows:
(A) 100 parts by weight of PI-1-5 (polyimide resin);
(B) 20 parts by weight of A-1 (pre-polymerised bismaleimide resin);
(C) 10 parts by weight of NC-3000H (biphenyl epoxy resin);
(D) 5 parts by weight of HP-5000 (naphthalene-containing epoxy resin);
(E) 80 parts by weight of BTP-6020 (cyanate ester resin);
(F) 10 parts by weight of SA-9000 (polyphenylene ether resin);
(G) 5 parts by weight of Phenoxy (phenoxy resin);
(H) 60 parts by weight of Saytex 8010 (flame retardant);
(I) 10 parts by weight of Ricon257 (polyolefin resin);
(J) 5 parts by weight of R-45vt (polyolefin resin);
(K) 15 parts by weight of Ricon184MA6 (polyolefin resin);
(L) 0.5 part by weight of TPP-S (triphenylphosphine triphenylborane catalyst);
(M) 0.1 part by weight of DCP (peroxides);
(N) 10 parts by weight of 525 (silicon dioxide filler)
(O) 50 parts by weight of toluene (solvent);
(P) 20 parts by weight of butanone (solvent).

Embodiment 12 (E12)

A resin composition, comprising ingredients as follows:
(A) 100 parts by weight of PI-1-5 (polyimide resin);
(B) 25 parts by weight of A-1 (pre-polymerised bismaleimide resin);
(C) 15 parts by weight of HP-5000 (naphthalene-containing epoxy resin);
(D) 60 parts by weight of BTP-6020 (cyanate ester resin);
(E) 10 parts by weight of BA-3000 (cyanate ester resin);
(F) 60 parts by weight of SPB-100 (phosphazene compound);
(G) 5 parts by weight of R-45vt (polyolefin resin);
(H) 10 parts by weight of Ricon184MA6 (polyolefin resin);
(I) 0.5 part by weight of TPP-S (triphenylphosphine triphenylborane catalyst);
(J) 0.1 part by weight of DCP (peroxides);
(K) 10 parts by weight of 525 (silicon dioxide filler)
(L) 50 parts by weight of toluene (solvent);
(M) 20 parts by weight of butanone (solvent).

Comparison 1 (C1)

A resin composition, comprising ingredients as follows:
(A) 100 parts by weight of V-8000 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Comparison 2 (C2)

A resin composition, comprising ingredients as follows:
(A) 100 parts by weight of HR-16NN (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Comparison 3 (C3)

A resin composition, comprising ingredients as follows:
(A) 100 parts by weight of PI-1-5 (polyimide resin);
(B) 15 parts by weight of BMI-2300 (bismaleimide resin);
(C) 6 parts by weight of NC-3000H (biphenyl epoxy resin);

(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Comparison 4 (C4)

A resin composition, comprising ingredients as follows:
(A) 100 parts by weight of PI-1-5 (polyimide resin);
(B) 15 parts by weight of KI-80 (bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Comparison 5 (C5)

A resin composition, comprising ingredients as follows:
(A) 50 parts by weight of V-8000 (polyimide resin);
(B) 50 parts by weight of HR-16NN (polyimide resin);
(C) 15 parts by weight of BMI-2300 (bismaleimide resin);
(D) 6 parts by weight of NC-3000H (biphenyl epoxy resin);
(E) 4 parts by weight of HP-5000 (naphthalene-containing epoxy resin);
(F) 50 parts by weight of BTP-6020 (cyanate ester resin);
(G) 10 parts by weight of OPE-2st (polyphenylene ether resin);
(H) 40 parts by weight of SPB-100 (phosphazene compound);
(I) 0.5 part by weight of TPP-S (triphenylphosphine triphenylborane catalyst);
(J) 0.1 part by weight of DCP (peroxides);
(K) 50 parts by weight of toluene (solvent);
(L) 20 parts by weight of butanone (solvent).

Comparison 6 (C6)

A resin composition, comprising ingredients as follows:
(A) 50 parts by weight of PI-1-5 (polyimide resin);
(B) 50 parts by weight of V-8000 (polyimide resin);
(C) 15 parts by weight of BMI-2300 (bismaleimide resin);
(D) 6 parts by weight of NC-3000H (biphenyl epoxy resin);
(E) 4 parts by weight of HP-5000 (naphthalene-containing epoxy resin);
(F) 50 parts by weight of BTP-6020 (cyanate ester resin);
(G) 10 parts by weight of HPC-8000-65T (polyester resin);
(H) 0.5 part by weight of TPP-S (triphenylphosphine triphenylborane catalyst);
(I) 0.1 part by weight of DCP (peroxides);
(J) 50 parts by weight of toluene (solvent);
(K) 20 parts by weight of butanone (solvent).

Comparison 7 (C7)

A resin composition, comprising ingredients as follows:
(A) 50 parts by weight of PI-1-5 (polyimide resin);
(B) 50 parts by weight of HR-16NN (polyimide resin);
(C) 15 parts by weight of BMI-2300 (bismaleimide resin);
(D) 6 parts by weight of NC-3000H (biphenyl epoxy resin);
(E) 4 parts by weight of HP-5000 (naphthalene-containing epoxy resin);
(F) 50 parts by weight of BTP-6020 (cyanate ester resin);
(G) 10 parts by weight of HPC-8000-65T (polyester resin);
(H) 0.5 part by weight of TPP-S (triphenylphosphine triphenylborane catalyst);
(I) 0.1 part by weight of DCP (peroxides);
(J) 50 parts by weight of toluene (solvent);
(K) 20 parts by weight of butanone (solvent).

Comparison 8 (C8)

A resin composition, comprising ingredients as follows:
(A) 100 parts by weight of PI-1-7 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

Comparison 9 (C9)

A resin composition, comprising ingredients as follows:
(A) 100 parts by weight of PI-1-8 (polyimide resin);
(B) 15 parts by weight of A-1 (pre-polymerised bismaleimide resin);
(C) 6 parts by weight of NC-3000H (biphenyl epoxy resin);
(D) 4 parts by weight of HP-5000 (naphthalene-containing epoxy resin);
(E) 50 parts by weight of BTP-6020 (cyanate ester resin);
(F) 60 parts by weight of SPB-100 (phosphazene compound);
(G) 0.5 part by weight of TPP-S (triphenylphosphine triphenylborane catalyst);
(H) 0.1 part by weight of DCP (peroxides);
(I) 50 parts by weight of toluene (solvent);
(J) 20 parts by weight of butanone (solvent).

The chemicals for use in the aforesaid production examples, embodiments and comparisons are as follows:
MDEA: 4,4'-diamino-3,3',5,5'-tetraethyldiphenylmethane purchased from Lonza
D-2000: polyoxypropylene diamine purchased from Huntsman
AMP: 4-aminophenol purchased from TCI America
BTDA: 3,3',4,4'-Benzophenonetetracarboxylic dianhydride purchased from TCI America
OPDA: 4,4'-Oxydiphthalic anhydride purchased from TCI America
TPE-R: 1,3-Bis (4-aminophenoxy) benzene purchased from TCI America
BAPP: 2,2-Bis [4-(4-aminophenoxy)phenyl]propane purchased from TCI America V-8000: polyimide resin purchased from DIC
HR-16NN: polyimide resin purchased from Toyobo
BMI-2300, BMI-5100, BMI-1700: bismaleimide purchased from Daiwa Kasei
KI-80: bismaleimide purchased from KI Chemical
NC-3000H: biphenyl epoxy resin purchased from Nippon Kayaku
HP-5000: naphthalene-containing epoxy resin purchased from D.I.C.
BTP-6020, BA-3000: cyanate ester resin purchased from Lonza
OPE-2st: vinylbenzyl-terminated biphenyl polyphenylene ether resin purchased from Mitsubishi Gas Chemical
SA-9000: methacrylate-terminated bisphenol-A polyphenylene ether resin purchased from Sabic
HPC-8000-65T: polyester resin purchased from D.I.C.
Phenoxy: phenoxy resin purchased from Inchem Corp.
Saytex 8010: decabromodiphenyl ether flame retardant purchased from Albemarle
SPB-100: phosphazene compound purchased from Otsuka Chemical
Ricon257: styrene-butadiene-divinylbenzene terpolymer purchased from Cray Valley
R-45vt: polybutadiene-urethane-methylmethacrylate terpolymer purchased from Cray Valley
Ricon184MA6: styrene-polybutadiene-maleic anhydride terpolymer purchased from Cray Valley
TPP-S: triphenylphosphine triphenylborane catalyst
DCP: dicumyl peroxide
525: fused silicon dioxide The resin compositions in the aforesaid embodiments 1 through 12 are listed in Table 2. The resin compositions in the aforesaid comparisons 1 through 9 are listed in Table 4.

TABLE 2

| | Ingredient | E1-1 | E1-2 | E1-3 | E1-4 | E1-5 | E1-6 | E2 | E3 | E4 | E5 | E6 | E7 | E8 | E9 | E10 | E11 | E12 |
|---|---|---|---|---|---|---|---|---|---|---|---|---|---|---|---|---|---|---|
| polyimide resin | PI-1-1 | 100 | — | — | — | — | — | — | — | — | — | — | — | — | — | — | — | — |
| | PI-1-2 | — | 100 | — | — | — | — | — | — | — | — | — | — | — | — | — | — | — |
| | PI-1-3 | — | — | 100 | — | — | — | — | — | — | — | — | — | — | — | — | — | — |
| | PI-1-4 | — | — | — | 100 | — | — | — | — | — | — | — | — | — | — | — | — | — |
| | PI-1-5 | — | — | — | — | 100 | — | 100 | 100 | 100 | 100 | 100 | 100 | 100 | 100 | 100 | 100 | 100 |
| | PI-1-6 | — | — | — | — | — | 100 | — | — | — | — | — | — | — | — | — | — | — |
| | V-8000 | — | — | — | — | — | — | — | — | — | — | — | — | — | — | — | — | — |
| | HR-16NN | — | — | — | — | — | — | — | — | — | — | — | — | — | — | — | — | — |
| maleimide resin | A-1 | 15 | 15 | 15 | 15 | 15 | 15 | — | — | 30 | — | 15 | 15 | 15 | 15 | 10 | 20 | 25 |
| | A-2 | — | — | — | — | — | — | 15 | — | — | — | — | — | — | — | — | — | — |
| | A-3 | — | — | — | — | — | — | — | 7.5 | — | — | — | — | — | — | — | — | — |
| | A-4 | — | — | — | — | — | — | — | 7.5 | — | — | — | — | — | — | — | — | — |
| | KI-80 | — | — | — | — | — | — | — | — | — | — | — | — | — | — | — | — | — |
| | BMI-2300 | — | — | — | — | — | — | — | — | — | — | — | — | — | — | — | — | — |
| thermo-setting resin | NC-3000H | 6 | 6 | 6 | 6 | 6 | 6 | 6 | 6 | 6 | 6 | — | 15 | 6 | 6 | — | 10 | — |
| | HP-5000 | 4 | 4 | 4 | 4 | 4 | 4 | 4 | 4 | 4 | 4 | — | 15 | 4 | 4 | 10 | 5 | 15 |
| | BTP-6020 | 50 | 50 | 50 | 50 | 50 | 50 | 50 | 50 | 50 | 50 | 50 | 50 | 10 | 100 | 60 | 80 | 60 |
| | BA-3000 | — | — | — | — | — | — | — | — | — | — | — | — | — | — | — | — | 10 |
| | OPE-2st | — | — | — | — | — | — | — | — | — | — | — | — | — | — | 10 | — | — |
| | SA-9000 | — | — | — | — | — | — | — | — | — | — | — | — | — | — | — | 10 | — |
| | HPC-8000-65T | — | — | — | — | — | — | — | — | — | — | — | — | — | — | — | — | — |
| | Phenoxy | — | — | — | — | — | — | — | — | — | — | — | — | — | — | 5 | 5 | — |
| flame retardant | Saytex 8010 | — | — | — | — | — | — | — | 60 | — | — | — | — | — | — | — | 60 | — |
| | SPB-100 | 60 | 60 | 60 | 60 | 60 | 60 | 60 | — | 60 | 60 | 60 | 60 | 60 | 60 | 60 | 0 | 60 |
| polyolefin resin | Ricon 257 | — | — | — | — | — | — | — | — | — | — | — | — | — | — | 5 | 10 | — |
| | R-45vt | — | — | — | — | — | — | — | — | — | — | — | — | — | — | 10 | 5 | 5 |
| | Ricon184MA6 | — | — | — | — | — | — | — | — | — | — | — | — | — | — | 10 | 15 | 10 |
| curing accelerator | TPP-S | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| | DCP | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 | 0.1 |
| inorganic filler | 525 | — | — | — | — | — | — | — | — | — | — | — | — | — | — | 5 | 10 | 10 |
| solvent | Toluene | 50 | 50 | 50 | 50 | 50 | 50 | 50 | 50 | 50 | 50 | 50 | 50 | 50 | 50 | 50 | 50 | 50 |
| | MEK | 20 | 20 | 20 | 20 | 20 | 20 | 20 | 20 | 20 | 20 | 20 | 20 | 20 | 20 | 20 | 20 | 20 |

TABLE 3

| | E1-1 | E1-2 | E1-3 | E1-4 | E1-5 | E1-6 | E2 | E3 | E4 |
|---|---|---|---|---|---|---|---|---|---|
| Physical Properties | | | | | | | | | |
| Is BMI separated out ? | No | No | No | No | No | No | No | No | No |
| Resin Film Characteristic | | | | | | | | | |
| film-forming capability | ○ | ○ | ○ | ◎ | ◎ | ◎ | ◎ | ◎ | X |
| endurance bending test | ○ | ○ | ○ | ◎ | ◎ | ◎ | ◎ | ◎ | X |
| Lamination Process Characteristic | | | | | | | | | |
| lamination temperature of 150° C. to 200° C. | applicable | applicable | applicable | applicable | applicable | applicable | applicable | applicable | applicable |
| lamination fluidity (dryness or no dryness) | no dryness | no dryness | no dryness | no dryness | no dryness | no dryness | no dryness | no dryness | no dryness |
| filling of through hole (quantity of voids) | no void | no void | no void | no void | no void | no void | no void | no void | no void |

TABLE 3-continued

| Laminate Characteristic | Testing Technique | | | | | | | | |
|---|---|---|---|---|---|---|---|---|---|
| Tg | TMA/° C. | 114 | 125 | 135 | 145 | 155 | 160 | 155 | 155 | 163 |
| S/D heat resistance | S/D (cycles) | >15 | >15 | >15 | >15 | >15 | >15 | >15 | >15 | >15 |
| dielectric constant | Dk@2 GHz | 2.98 | 2.98 | 2.96 | 2.92 | 2.87 | 2.76 | 2.76 | 2.76 | 2.98 |
| dissipation factor | Df@2 GHz | 0.0095 | 0.0095 | 0.0093 | 0.0087 | 0.0088 | 0.0088 | 0.0088 | 0.0081 | 0.0092 |
| flaming test | UL94 | V-0 | V-0 | V-0 | V-0 | V-0 | V-0 | V-0 | V-0 | V-0 |

| | | E5 | E6 | E7 | E8 | E9 | E10 | E11 | E12 |
|---|---|---|---|---|---|---|---|---|---|
| Physical Properties | | | | | | | | | |
| Is BMI separated out ? | | No | No | No | No | No | No | No | No |
| Resin Film Characteristic | | | | | | | | | |
| film-forming capability | | ◎ | ◎ | X | ○ | ○ | ◎ | ◎ | ◎ |
| endurance bending test | | ◎ | ◎ | X | ○ | X | ◎ | ◎ | ◎ |
| Lamination Process Characteristic | | | | | | | | | |
| lamination temperature of 150° C. to 200° C. | | applicable | applicable | applicable | applicable | applicable | applicable | applicable | applicable |
| lamination fluidity (dryness or no dryness) | | no dryness | no dryness | no dryness | no dryness | no dryness | no dryness | no dryness | no dryness |
| filling of through hole (quantity of voids) | | no void | no void | no void | no void | no void | no void | no void | no void |
| Laminate Characteristic | Testing Technique | | | | | | | | |
| Tg | TMA/° C. | 130 | 155 | 169 | 115 | 190 | 180 | 184 | 182 |
| S/D heat resistance | S/D (cycles) | >15 | >15 | >15 | 9 | >15 | >15 | >15 | >15 |
| dielectric constant | Dk@2 GHz | 2.77 | 2.76 | 3.5 | 3.05 | 2.78 | 2.75 | 2.76 | 2.76 |
| dissipation factor | Df@2 GHz | 0.0081 | 0.0075 | 0.012 | 0.0102 | 0.0078 | 0.0075 | 0.0073 | 0.0075 |
| flaming test | UL94 | V-1 | V-0 | V-1 | V-0 | V-1 | V-0 | V-0 | V-0 |

The resin compositions in the aforesaid embodiments 1 through 12 and comparisons 1 through 9 are stirred in a blending tank batch by batch to mix evenly. A tiny portion (around 50 grams) of each of the solutions in embodiments 1 through 12 and comparisons 1 through 9 is taken out and placed in a glass jar to stand still for one day. Afterward, the inventor of this present invention observes with the naked eye whether the varnish (i.e., the mixed solution) has separated out bismaleimide, wherein whatever pale yellow substance found at the bottom of the glass jar is presumed to be the bismaleimide thus separated out. Then, the aforesaid evenly mixed solution is applied to a PET film with a coater such that the resin composition is uniformly attached to the PET film before being baked to a B-staged state and thus obtain a resin film. In this regard, the aforesaid baking process is carried out at 160° C. for 4 minutes in embodiments 1 through 12 and comparisons 3 and 4 and at 120° C. for 4 minutes in comparisons 1, 2, 5, 6, 7, 8 and 9.

The resin film manufactured in the aforesaid embodiments 1 through 12 and comparisons 1 through 9 is observed with the naked eye to examine its surface for film-forming capability and grade it as good (◎), normal (○), and bad (X). The surface of the resin film is graded as normal when the number of pin holes (also known as fish eyes, characterized by a "spread out" phenomenon) founded on the surface of the resin film is small, bad when a large number of pin holes are found, and good when no pin hole is found, i.e., when the surface of the resin film is flat. Furthermore, the resin film in the aforesaid embodiments 1 through 12 and comparisons 1 through 9 is bent by 180 degrees to observe its endurance bending (i.e., non-brittleness) test. The endurance bending test of the resin film is evaluated and also expressed by three grades, namely as good (◎), normal (○), and bad (X). The resin film is graded as good when found to be non-brittle, normal when slightly brittle, and bad when very brittle.

In addition, the resin composition in the aforesaid embodiments 1 through 12 and comparisons 1 through 9 is introduced into the blending tank batch by batch and mixed therein evenly. Then, the mixed solution is applied to a copper foil (HTE copper foil, half ounce) with a coater before being baked to the B-staged state and obtain a resin coated copper (RCC). The aforesaid baking process is carried out at 160° C. for 4 minutes in embodiments 1 through 12 and comparisons 3 and 4. And baking process is carried out at 120° C. for 4 minutes in comparisons 1, 2, 5, 6, 7, 8 and 9. The aforesaid manufacturing method is applicable to the resin coated copper (RCC) and similar to the manufacturing method of the resin film, but the test described below is conducted on the aforesaid resin film.

Two pieces of resin film (around 50 μm thick) prepared by the same batch, two pieces of 18-μm (half ounce) copper foil, and a core laminate are stacked in the sequence of copper foil, resin film, core laminate, resin film, and copper foil. The core laminate is 4 mil thick and its surface has a circuit made of a half ounce of copper foil, wherein the circuit has a line width/line patch of 3/3 mil. A through hole of a diameter of 0.8 mm is formed in the core laminate. After the pieces of resin film are stacked in one direction, the PET film facing an opposing direction must be removed from the exposed sides of the pieces of resin film before a process of stacking the pieces of resin film in the opposing direction begins Upon completion of the stacking process, the result structure is known as a stacked structure 1. One piece of resin film (around 50 μm thick) prepared by the same batch and two pieces of 18-μm copper foil are stacked in the sequence of copper foil, resin film, and copper foil. After a single piece of resin film is stacked in one direction, the PET film facing an opposing direction must be removed from the exposed sides of the pieces of resin film before a process of stacking the pieces of resin film in the opposing direction begins Upon completion of the stacking process, the result structure is known as a stacked structure 2. Afterward, the stacked structure 1 and the stacked structure 2 are put in a lamination machine and laminated together therein under a vacuum condition, at 200° C., and for 2 hours to form a copper clad laminate. The two pieces of resin film of the stacked structure 1 are cured to form the insulating layer between the copper foil and the core laminate. The single piece of resin film of the stacked structure 2 is cured to form the insulating layer between the two pieces of copper foil.

Regarding the stacked structure 1, the copper foil disposed on the surface of the laminate after the lamination process is etched, and then the laminate is examined with the naked eye to see whether the surface of the resin-based insulating layer is dry. A dry surface of the resin-based insulating layer indicates that the weave texture of the surface of the laminate is exposed. Alternatively, the laminate is sliced and then observed under an electronic microscope to see whether there is any void inside the laminate. Afterward, the aforesaid slice of the laminate is sampled and evaluated under a SEM for the degree of the filling of the through hole. A through hole without any void therein indicates a high degree of filling, whereas a through hole with numerous voids therein indicates a low degree of filling.

The copper clad laminate produced as a result of a lamination process performed on the stacked structure 2 is sampled to produce a copper-clad laminate which is 3 inch×3 inch in size, and then the solder dipping (S/D) heat resistance of the copper-clad laminate is measured. The copper-clad laminate is dipped into a solder furnace at 288° C. for 10 seconds and then taken out of the solder furnace to be observed for rupture (i.e., delaminated). If no rupture is found, the copper-clad laminate will be dipped into the solder furnace for 10 seconds again before being tested for the number of heat resistance cycles. Rupture is indicated by any crack in the insulating layer or separation of the insulating layer and the copper foil.

The copper foil disposed on the surface of the aforesaid copper-clad laminate is etched, and then the copper-free laminate undergoes the following characteristic measurement tests: glass transition temperature (Tg) measured with a TMA instrument, dielectric constant (Dk) measured at 2 GHz with a microwave dielectrometer (the lower the Dk is, the better the dielectric property of the copper-free laminate is, wherein a difference of 0.1 in Dk is deemed significant by persons skilled in the art), dissipation factor (Df) measured at 2 GHz with a microwave dielectrometer (the lower the Df is, the better the dielectric property of the copper-free laminate is, wherein a difference of 0.001 in Df is deemed significant by persons skilled in the art), and a flaming test (conducted in accordance with a UL94 testing technique, wherein grade V-0 is better than grade V-1, and the complete combustion of the laminate is recorded as "burnt"). The results of the physical properties of the laminates made from the resin compositions recited in embodiments 1 through 12 are shown in Table 3, whereas those in comparisons 1 through 9 are shown in Table 5. Referring to Table 3 and Table 5, a comprehensive comparison between the embodiments and the comparisons reveals that the Dk and Df of the laminates made from a polyimide resin synthesized from diamines not provided in the form of MDEA and D-2000 are significantly high. Referring to Table 3 and Table 5, a comprehensive comparison between the embodiments 1 through 12 and the comparisons 1 and 2 reveals that the pre-polymerised bismaleimide resin does not cause the release of a bismaleimide resin.

TABLE 4

| Ingredient | | C1 | C2 | C3 | C4 | C5 | C6 | C7 | C8 | C9 |
|---|---|---|---|---|---|---|---|---|---|---|
| polyimide resin | PI-1-1 | — | — | — | — | — | — | — | — | — |
| | PI-1-2 | — | — | — | — | — | — | — | — | — |
| | PI-1-3 | — | — | — | — | — | — | — | — | — |
| | PI-1-4 | — | — | — | — | — | — | — | — | — |
| | PI-1-5 | — | — | 100 | 100 | — | 50 | 50 | — | — |
| | PI-1-6 | — | — | — | — | — | — | — | — | — |
| | PI-1-7 | — | — | — | — | — | — | — | 100 | — |
| | PI-1-8 | — | — | — | — | — | — | — | — | 100 |
| | V-8000 | 100 | — | — | — | 50 | 50 | — | — | — |
| | HR-16NN | — | 100 | — | — | 50 | — | 50 | — | — |
| maleimide resin | A-1 | 15 | 15 | — | — | — | — | — | 15 | 15 |
| | A-2 | — | — | — | — | — | — | — | — | — |
| | A-3 | — | — | — | — | — | — | — | — | — |
| | A-4 | — | — | — | — | — | — | — | — | — |
| | KI-80 | — | — | — | 15 | — | — | — | — | — |
| | BMI-2300 | — | — | 15 | — | 15 | 15 | 15 | — | — |
| thermosetting resin | NC-3000H | 6 | 6 | 6 | 6 | 6 | 6 | 6 | 6 | 6 |
| | HP-5000 | 4 | 4 | 4 | 4 | 4 | 4 | 4 | 4 | 4 |
| | BTP-6020 | 50 | 50 | 50 | 50 | 50 | 50 | 50 | 50 | 50 |
| | BA-3000 | — | — | — | — | — | — | — | — | — |
| | OPE-2st | — | — | — | — | 10 | — | — | — | — |
| | SA-9000 | — | — | — | — | — | — | — | — | — |
| | HPC-8000-65T | — | — | — | — | — | 10 | 10 | — | — |
| | Phenoxy | — | — | — | — | — | — | — | — | — |
| flame retardant | Saytex 8010 | — | — | — | — | — | — | — | — | — |
| | SPB-100 | 60 | 60 | 60 | 60 | 40 | — | — | 60 | 60 |

TABLE 4-continued

| Ingredient | | C1 | C2 | C3 | C4 | C5 | C6 | C7 | C8 | C9 |
|---|---|---|---|---|---|---|---|---|---|---|
| polyolefin resin | Ricon257 | — | — | — | — | — | — | — | — | — |
| | R-45vt | — | — | — | — | — | — | — | — | — |
| | Ricon184MA6 | — | — | — | — | — | — | — | — | — |
| curing accelerator | TPP-S | 0.5 | 0.5 | 0.5 | 0.5 | 0.5 | 0.5 | 0.5 | 0.5 | 0.5 |
| | DCP | 0.1 | 0.1 | 0.1 | 0.1 | 0.1 | 0.1 | 0.1 | 0.1 | 0.1 |
| inorganic filler | 525 | — | — | — | — | — | — | — | — | — |
| solvent | Toluene | 50 | 50 | 50 | 50 | 50 | 50 | 50 | 50 | 50 |
| | MEK | 20 | 20 | 20 | 20 | 20 | 20 | 20 | 20 | 20 |

TABLE 5

| | | C1 | C2 | C3 | C4 | C5 |
|---|---|---|---|---|---|---|
| Physical Properties | | | | | | |
| Is BMI separated out? | | No | No | Yes | Yes | Yes |
| Resin Film Characteristic | | | | | | |
| film-forming capability | | X | ◎ | ◎ | ◎ | X |
| endurance bending test | | X | X | ◎ | ◎ | X |
| Lamination Process Characteristic | | | | | | |
| lamination temperature of 150° C. to 200° C. | | not applicable | not applicable | applicable | applicable | not applicable |
| lamination fluidity (dryness or no dryness) | | dryness | no dryness | no dryness | no dryness | dryness |
| filling of through hole (quantity of voids) | | numerous voids | a few voids | no void | no void | numerous voids |
| Laminate Characteristic | Testing Technique | | | | | |
| Tg | TMA/° C. | 210 | 220 | 159 | 150 | 212 |
| S/D heat resistance | S/D (cycles) | >15 | >15 | 10 | >15 | >15 |
| dielectric constant | Dk@2 GHz | 3.56 | 3.33 | 3.03 | 3.13 | 3.12 |
| dissipation factor | Df@2 GHz | 0.0102 | 0.011 | 0.009 | 0.009 | 0.010 |
| flaming test | UL94 | V-0 | V-0 | V-0 | V-0 | V-1 |

| | | C6 | C7 | C8 | C9 |
|---|---|---|---|---|---|
| Physical Properties | | | | | |
| Is BMI separated out? | | Yes | Yes | No | No |
| Resin Film Characteristic | | | | | |
| film-forming capability | | X | ◎ | ◎ | ◎ |
| endurance bending test | | X | X | ◎ | ◎ |
| Lamination Process Characteristic | | | | | |
| lamination temperature of 150° C. to 200° C. | | not applicable | not applicable | not applicable | not applicable |
| lamination fluidity (dryness or no dryness) | | dryness | no dryness | inoperable for lack of fluidity | inoperable for lack of fluidity |
| filling of through hole (quantity of voids) | | numerous voids | a few voids | cannot be filled | cannot be filled |
| Laminate Characteristic | Testing Technique | | | | |
| Tg | TMA/° C. | 195 | 200 | 250 | 270 |
| S/D heat resistance | S/D (cycles) | >15 | >15 | >15 | >15 |
| dielectric constant | Dk@2 GHz | 3.09 | 2.99 | 3.25 | 3.45 |
| dissipation factor | Df@2 GHz | 0.010 | 0.013 | 0.0098 | 0.0105 |
| flaming test | UL94 | burnt | burnt | V-0 | V-0 |

A comparison between comparisons 8 and 9 shows that the reactants for use in synthesizing the polyimide resin include diamines (TPE-R and BAPP) of citations 1 and 2, and the polyimide resin thus synthesized features poor fluidity and thus is useless to a filling process. Furthermore, the polyimide resin thus synthesized is unfit for a lamination process carried out at 150° C. to 200° C., not to mention that the Dk of the resultant laminates is high.

The results of production examples 1-2 through 1-6 reveal that the molecular weight of the polyimide resin can be increased by increasing the MDEA content during the synthesis of the polyimide resin. The results of embodiments 1-2 through 1-6 reveal that the Tg of the laminate can be increased by increasing the MDEA content during the synthesis of the polyimide resin. A comparison between embodiments 1-5 and 2 and comparisons 1, 2 and 5 shows that a commercially available conventional polyimide resin (which does not contain MDEA and D-2000) causes the resultant laminates to have a high Df, the poor filling of the through hole (because of voids therein), and poor lamination fluidity (dryness).

Therefore, the results of the tests conducted in the aforesaid embodiments and comparisons show that a resin film or prepreg can be produced from a pre-polymerised maleimide resin and a polyimide resin synthesized from diamines with a specific structure according to the present invention to thereby attain satisfactory circuit laminate characteristics, such as a low dielectric constant, a low dissipation factor, high heat resistance, and high adhesiveness.

Hence, the present invention meets the three requirements of patentability, namely novelty, non-obviousness, and industrial applicability. Regarding novelty and non-obviousness, the present invention discloses a resin composition characterized by satisfactory circuit laminate characteristics, such as a low dielectric constant, a low dissipation factor, high heat resistance and high adhesiveness. Regarding industrial applicability, products derived from the present invention meet the current market demand fully.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A resin composition, comprising:
 (A) a polyimide resin;
 (B) a pre-polymerised maleimide resin;
 (C) a thermosetting resin; and
 (D) a flame retardant,
 wherein reactants for use in synthesizing the polyimide resin comprise an acid anhydride and diamines, with the diamines comprising a polyetherdiamine and at least one diamine selected from the group consisting of
 4,4'-Diamino-3,3',5,5'-tetraethyldiphenylmethane,
 4,4'-Diamino-3,3',5,5'-tetramethyldiphenylmethane,
 4,4'-Diamino-3,3'-dimethyldiphenylmethane, and
 4,4'-Diamino-3,3'-diethyldiphenylmethane.

2. The composition of claim 1, wherein the acid anhydride comprises at least one element selected from the group consisting of pyromellitic dianhydride, 3,3',4,4'-benzophenonetetracarboxylic dianhydride, bisphenol-A diphthalic anhydride, and 4,4'-oxydiphthalic anhydride.

3. The composition of claim 1, further comprising: (A) 100 parts by weight of a polyimide resin; (B) 10 to 50 parts by weight of a pre-polymerised maleimide resin; (C) 10 to 150 parts by weight of a thermosetting resin; and (D) 15 to 150 parts by weight of a flame retardant.

4. The composition of claim 1, wherein reactants for use in synthesizing the polyimide resin further comprise an end-capping compound, and the end-capping compound comprises at least one element selected from the group consisting of 4-Aminophenol, phthalic acid anhydride, maleic anhydride, Nadic anhydride, p-toluidine, p-anisidine, and p-phenoxyaniline.

5. The composition of claim 1, wherein reactants for use in synthesizing the pre-polymerised maleimide resin comprise a maleimide and a diamine.

6. The composition of claim 1, wherein the thermosetting resin comprises at least one element selected from the group consisting of an epoxy resin, a cyanate ester resin, a polyphenylene ether resin, a polyester resin, and a phenoxy resin.

7. The composition of claim 1, wherein the flame retardant is one of a phosphorus-containing flame retardant and a brominated flame retardant.

8. The composition of claim 1, further comprising at least one element selected from the group consisting of an inorganic filler, a thermoplastic resin, a curing accelerator, a silane coupling agent, a toughening agent, and a solvent.

9. The composition of claim 1, wherein the polyetherdiamine has two terminal primary amines whose polymer backbone comprises one of oxyethylene block, oxypropylene block, and a combination thereof.

10. The composition of claim 9, wherein the polyetherdiamine has a number average molecular weight (Mn) of 100 to 5,000.

11. An article, made from the resin composition of claim 1, which is a prepreg, a resin film, a resin coated copper, a laminate or a printed circuit board.

* * * * *